(12) United States Patent
Kameshima

(10) Patent No.: US 6,512,217 B1
(45) Date of Patent: *Jan. 28, 2003

(54) PHOTOELECTRIC CONVERSION APPARATUS, METHOD FOR DRIVING PHOTOELECTRIC CONVERSION APPARATUS, AND INFORMATION PROCESSING APPARATUS HAVING PHOTOELECTRIC CONVERSION APPARATUS

(75) Inventor: Toshio Kameshima, Sagamihara (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/363,821

(22) Filed: Jul. 30, 1999

(30) Foreign Application Priority Data

Jul. 31, 1998 (JP) .......................................... 10-217783

(51) Int. Cl.$^7$ ............................................. H01L 27/14
(52) U.S. Cl. .................................... 250/208.1; 348/300
(58) Field of Search ........................ 250/208.1, 370.08, 250/370.11, 214 R, 214.1; 378/98.8; 348/300–305, 246, 243

(56) References Cited

U.S. PATENT DOCUMENTS

| | | | | |
|---|---|---|---|---|
| 4,376,888 A | * | 3/1983 | Fukaya et al. | 250/214 R |
| 4,931,661 A | * | 6/1990 | Fukaya et al. | 250/208.1 |
| 5,665,968 A | * | 9/1997 | Meisburger et al. | 250/310 |
| 5,854,655 A | * | 12/1998 | Watanabe et al. | 348/247 |
| 5,912,465 A | | 6/1999 | Kobayashi et al. | 250/370.9 |
| 6,002,433 A | * | 12/1999 | Watanabe et al. | 348/246 |

* cited by examiner

Primary Examiner—Stephone B. Allen
(74) Attorney, Agent, or Firm—Fitzpatrick, Cella, Harper & Scinto

(57) ABSTRACT

In order to obtain a good image without degradation of image quality by permitting accurate detection of a defective pixel and further compensation for the defective pixel even with occurrence of the defect originating in TFT during operation, it is made possible to detect the defective pixel by self-diagnosis. The detection is carried out in such a manner that in a dark state the voltage applied to the photoelectric conversion elements is changed from a first voltage in normal reading to a second voltage and outputs read out of the charged photoelectric conversion elements are compared with a predetermined threshold.

73 Claims, 9 Drawing Sheets

PHOTOELECTRIC CONVERSION APPARATUS, METHOD FOR DRIVING PHOTOELECTRIC CONVERSION APPARATUS, AND INFORMATION PROCESSING APPARATUS HAVING PHOTOELECTRIC CONVERSION APPARATUS

BACKGROUND OF THE INVENTION

1. Field of the Invention

The present invention relates to a photoelectric conversion apparatus, a method for driving the photoelectric conversion apparatus, and an information processing apparatus having the photoelectric conversion apparatus and, more particularly, to a photoelectric conversion apparatus suitably used in X-ray image pickup apparatus, facsimile devices, scanners, and so on, a driving method of the photoelectric conversion apparatus, and an information processing apparatus provided therewith.

2. Related Background Art

FIG. 1 is a schematic circuit diagram to show the schematic structure of an example of the photoelectric conversion apparatus. In the figure, each pixel is composed of a photoelectric conversion element (a photodiode P1 to P4 in this example) and a thin film transistor (hereinafter abbreviated as TFT) T1 to T4. Numeral 1 denotes a power source connected to the photoelectric conversion elements, for applying the bias voltage thereto.

Charges generated in the respective photoelectric conversion elements P1 to P4 by incident light are transferred to a reading unit 2 by the thin film transistors (hereinafter called TFTs). The reading unit 2 is normally composed of amplifiers, an analog multiplexer, an A-D converter, a memory, etc. not illustrated. Further, numeral 3 designates a gate drive unit for applying a gate pulse Vg1 or Vg2 for control of on/off of the TFTs to the gate electrodes of the TFTs T1 to T4. The gate drive unit 3 is normally comprised of a shift register (not illustrated) or the like.

The photoelectric conversion elements P1 to P4 and the TFTs T1 to T4 are normally made of amorphous silicon materials or the like.

FIG. 2 is a timing chart to explain an example of reading operation of the photoelectric conversion apparatus. In the figure "Light" represents the timing of irradiation of light. After photocharges are accumulated in the respective photoelectric conversion elements P1 to P4 by the light irradiation, the gate drive unit 3 applies the gate pulse, as indicated by Vg1 and Vg2, to switch the TFTs T1, T3 on and then switch the TFTs T2, T4 on, whereby the charges generated by the light are transferred to the reading unit 2. The transferred charges are amplified, undergo A-D conversion, and are stored as image signals in the memory in the reading unit 2, and the signals are outputted to a monitor or the like as occasion may demand.

It is, however, commonly known that the performance of TFTs is degraded, that is, the threshold voltage Vth varies during the operation, in cases of TFTs made of the amorphous silicon materials. Particularly, where the photoelectric conversion apparatus is composed of an array of many pixels, variations etc. in production can cause variations in degrees of degradation of the TFTs. There are cases wherein some heavily degraded TFTs fail to transfer the charge successfully, so as to lower the output of pixels, compose defective pixels, and degrade the image quality.

In order to correct the variations of output, a potential method employed was to detect the defective pixels caused by the operation, based on a white image obtained under irradiation of light or X-rays or the like. It is, however, difficult to irradiate a large area with uniform light in general, and there were some cases wherein normal pixels were detected as defective pixels because of dust or the like on an illumination system or on the apparatus.

As described above, the photoelectric conversion apparatus had the problem of degradation of image quality, where the defective pixels appeared due to the degradation or the like of the TFTs during the operation. Further, the apparatus had another problem that it was considerably hard to accurately detect the defective pixels appearing during the operation per se.

SUMMARY OF THE INVENTION

The present invention has been accomplished in view of the above problems and an object of the present invention is to provide a photoelectric conversion apparatus, a driving method thereof, and an information processing apparatus provided therewith which permit accurate detection of the defective pixel or the like appearing during the operation of the photoelectric conversion apparatus or due to secular change of TFTs and which permit compensation for the defective pixels, so as to obtain a good image without substantial degradation of image quality.

Another object of the present invention is to provide a photoelectric conversion apparatus for reading information by arraying a plurality of pixels, each comprising a photoelectric conversion element and a thin film transistor connected to the element, and applying a voltage to gate electrodes of the thin film transistors to turn the thin film transistors on, the photoelectric conversion apparatus comprising a controllable power source for electrically charging the photoelectric conversion elements by changing a voltage applied to electrodes of the photoelectric conversion elements to which the thin film transistors are not connected, from a first voltage applied during normal reading to a second voltage and applying the second voltage to the electrodes in a dark state, and comparing means for comparing outputs read out of the charged photoelectric conversion elements with a predetermined threshold value to detect a defective pixel, and also to provide an information processing apparatus having the photoelectric conversion apparatus.

A further object of the present invention is to provide a method for driving a photoelectric conversion apparatus for reading information by arraying a plurality of pixels, each comprising a photoelectric conversion element and a thin film transistor connected to an output of the element, and applying a voltage to gate electrodes of the thin film transistors to turn the thin film transistors on, the apparatus having a reading mode and a self-diagnosis mode, the driving method comprising steps of electrically charging the photoelectric conversion elements by changing a voltage applied to electrodes of the photoelectric conversion elements to which the thin film transistors are not connected, from a first voltage applied in the reading mode to a second voltage and applying the second voltage to the electrodes in a dark state in the self-diagnosis mode, and comparing outputs read out of the charged photoelectric conversion elements with a predetermined threshold value to detect a defective pixel.

The present invention described above achieves the following operation; in the self-diagnosis mode the controllable power source changes and applies the voltage applied to the photoelectric conversion elements in the dark state, thereby charging the photoelectric conversion elements, not optically, but electrically, the charges are read out by the reading means, and the read outputs are compared with the predetermined threshold by the comparing means, so as to permit detection of the defective pixel.

Since the means for detecting the defective pixel by self-diagnosis has the function of switching two activity states of the reading mode and the self-diagnosis mode, the self-diagnosis can be performed even after activation of the apparatus by switching the mode into the self-diagnosis mode to find a defect due to a degraded TFT during the normal reading operation. Namely, the self-diagnosis can be performed at will of user or serviceman upon on of the main power supply, or by switching a changing switch.

By storing positional information of each defective pixel detected in the memory, the position of the defective pixel can be identified accurately and compensation by compensation means becomes easier.

DETAILED DESCRIPTION OF THE PREFERRED EMBODIMENTS

Embodiments of the present invention will be described in detail by reference to the drawings.

<First Embodiment>

Figure 1:
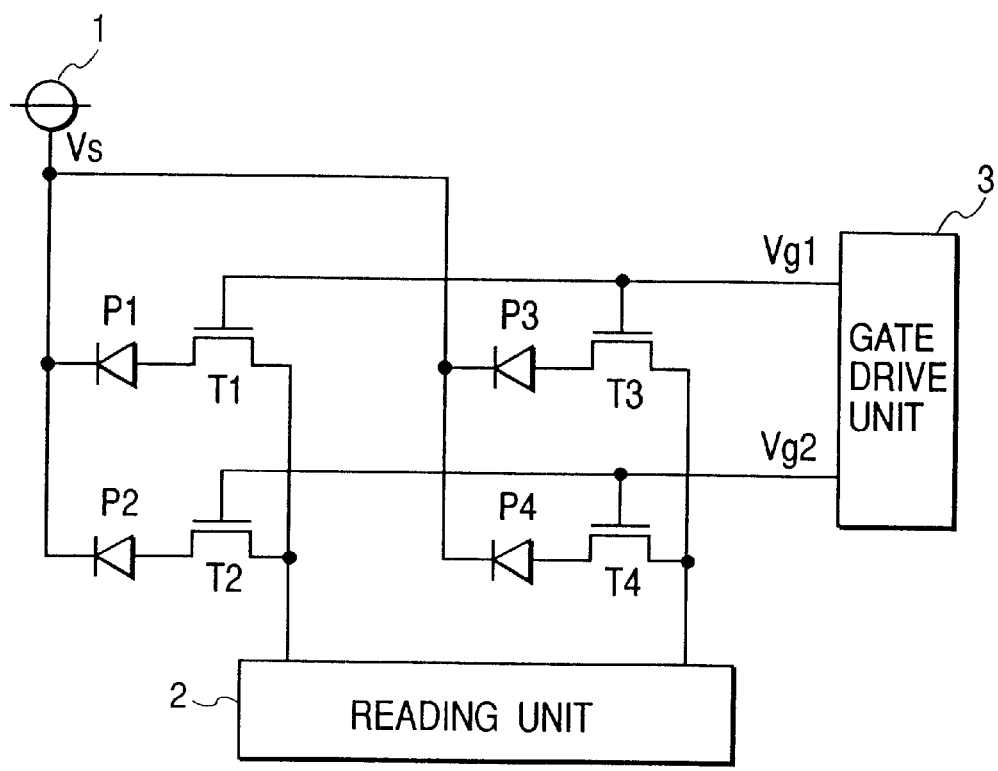
FIG. 1 shows schematically a circuit diagram of a substantial structure of an example of a photoelectric conversion apparatus.
Figure 2:
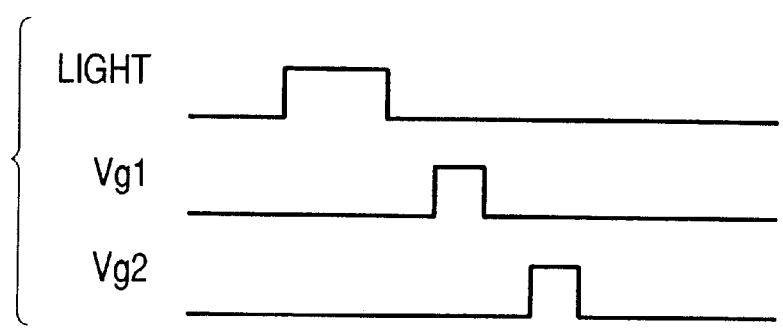
FIG. 2 shows a timing chart for explaining an example of a reading operation by the photoelectric conversion apparatus.
Figure 3:
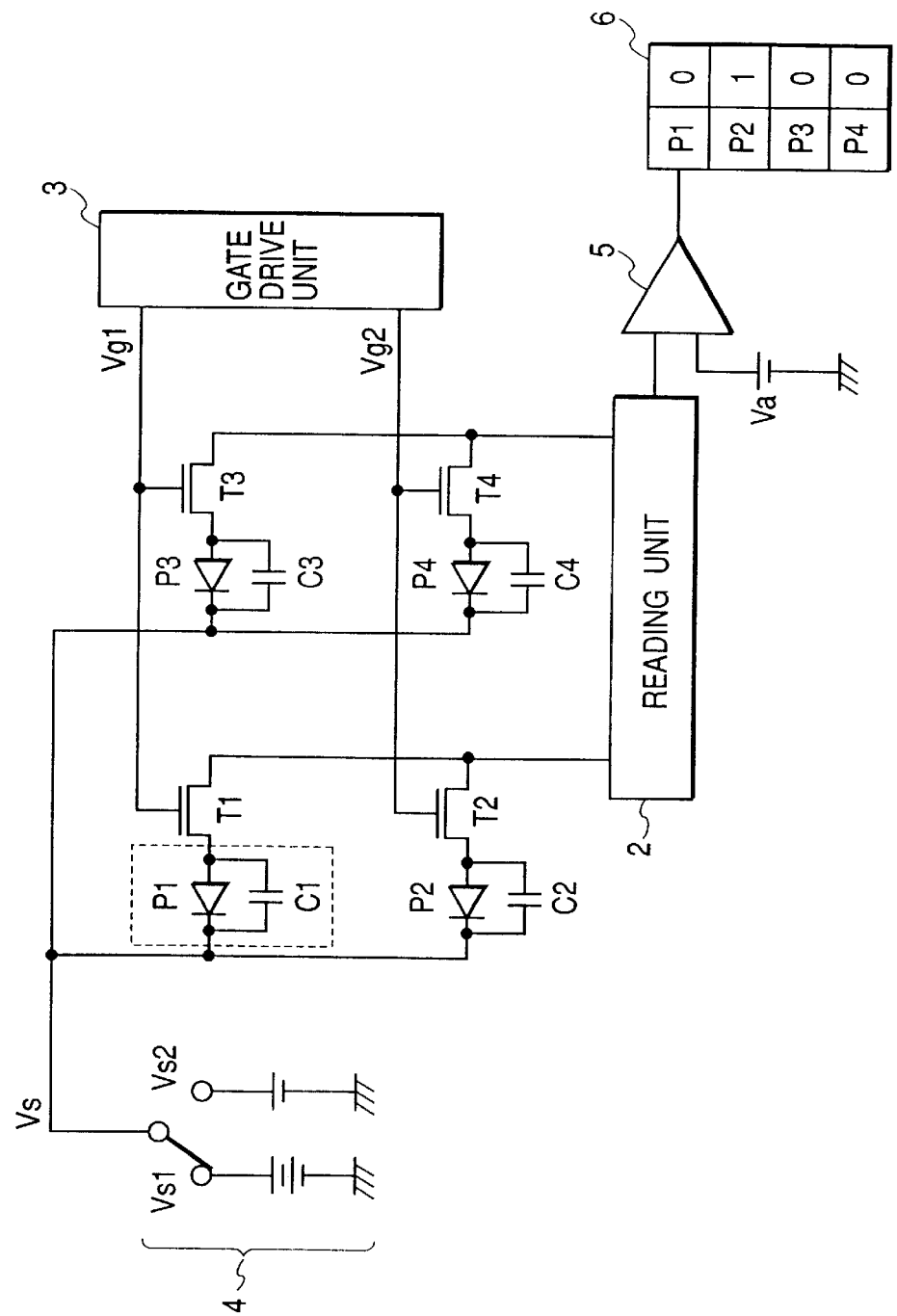
FIG. 3 shows schematically a circuit diagram of an example of a desirable photoelectric conversion apparatus according to the present invention.
Figure 4:
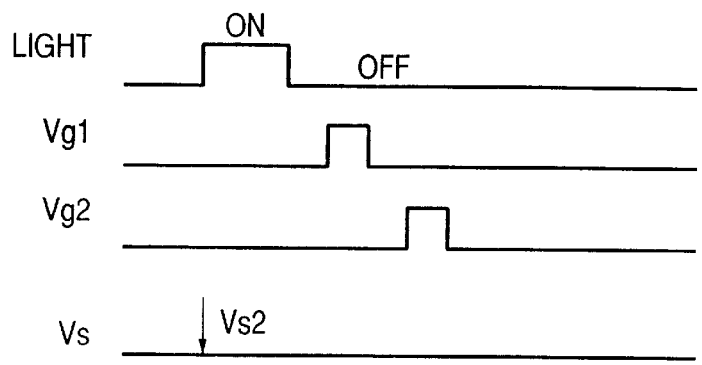
FIG. 4 shows a timing chart for explaining an example of an operation of the photoelectric conversion apparatus in FIG. 3.
Figure 4:
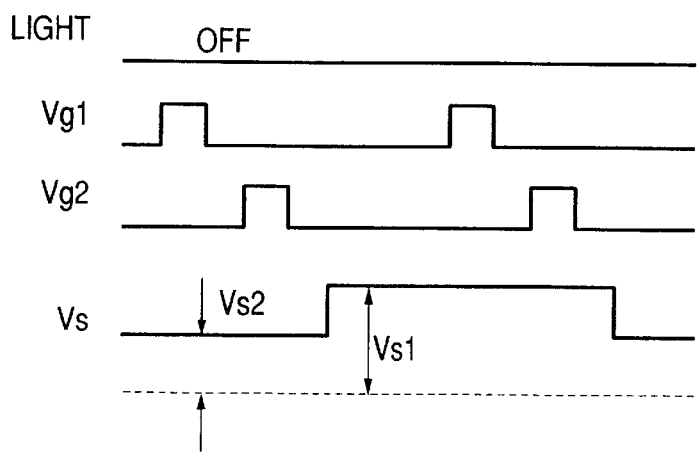
Figure 5A:
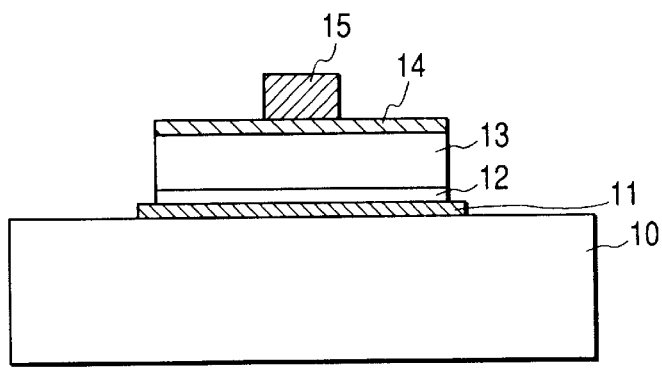
FIG. 5A shows schematically a sectional view of an example of a photoelectric conversion element for use in the photoelectric conversion apparatus according to the present invention.

FIG. 3 is a schematic circuit diagram to show an example of the preferred photoelectric conversion apparatus of the present invention. FIG. 4 is a timing chart to explain an example of the operation. Further, FIG. 5A shows a schematic, sectional view of an example of the photoelectric conversion elements used in the photoelectric conversion apparatus of the present invention, and FIG. 5B a schematic equivalent circuit thereof. The elements having the same functions as those in FIG. 1 are denoted by the same reference symbols.

Figure 5B:
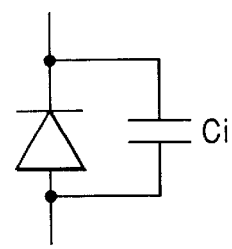
FIG. 5B shows schematically an equivalent circuit of one in FIG. 5A.

In the present embodiment the photoelectric conversion elements are comprised of pin type photodiodes made of amorphous silicon materials as illustrated in FIG. 5A. The pin type photodiodes are usually constructed in the structure of a stack of first electrode layer 11, p-type amorphous silicon layer 12, amorphous silicon semiconductor layer 13, n-type amorphous silicon layer 14, and second electrode layer 15 on glass substrate 10. The pin type photodiode can be represented by a diode and a capacitor as illustrated in FIG. 5B.

As illustrated in FIG. 3, the second electrode layers 15 of the pin photodiodes illustrated in FIG. 5A are connected in common to a bias line Vs and a controllable power supply 4 applies the bias thereto. The controllable power supply can apply at least two types of voltages Vs1, Vs2, as described hereinafter.

The TFTs (thin film transistors) T1 to T4 are TFTs connected to first electrodes of the respective photodiodes P1 to P4 and adapted for transferring charges generated in the photodiodes P1 to P4 and stored in the capacitors C1 to C4, to the reading unit 2.

The reading unit 2 is composed of amplifiers, an analog multiplexer, an A-D converter, a memory, etc. not illustrated. This reading unit 2 is normally composed of external IC or the like. Further, connected to the gate electrodes of the TFTs T1 to T4 is the gate drive unit 2 for applying the gate pulse Vg1 or Vg2 for control of on/off of the TFTs. A comparator 5 is also connected to the reading unit 2 to compare the output of the reading unit 2 with a threshold value (a threshold voltage Va in the example of FIG. 3) and write the comparison result in a memory for storage of defective position. The photodiodes and TFTs are normally deposited and formed by the amorphous silicon process or the like.

The photoelectric conversion apparatus of the present invention has a reading mode and a self-diagnosis mode in the operation. This can be implemented as follows; the user or the serviceman for carrying out maintenance of the apparatus switches the modes at will by a mode changing switch not illustrated; or the apparatus may be designed to carry out the self-diagnosis mode automatically, for example, with on of the unrepresented main power supply of the apparatus by a logical circuit configuration often used normally, a control program of a microcomputer, or the like, and thereafter turn the mode into the reading mode.

As illustrated in FIG. 3, the photoelectric conversion apparatus of the present invention has the reading mode and the self-diagnosis mode in the operation.

The reading mode will be described first. The controllable power source 4 is put in the state of the voltage Vs2. In this example of the pin photodiodes of the present embodiment, the relation of the voltages Vs1 and Vs2 is Vs1>Vs2 and, specifically, Vs1=15 V and Vs2=10 V, for example. The MIS type or selenium photodiodes in the subsequent embodiments are also charged in the negative even in the relation of Vs1<Vs2.

In this state, the photodiodes are exposed to the light at the timing of on of Light in the figure and charges corresponding to quantities of light are stored in C1 to C4. After that, the gate drive circuit successively applies the gate pulses Vg1 and Vg2 to the gate electrodes of the TFTs, whereupon the charges of the respective pixels are transferred to the reading unit 2. Then the charges are amplified by the amplifiers not illustrated, are multiplexed, are converted into digital signals by the A-D converter, and are stored in the frame memory not illustrated. The digital image signals stored in the frame memory are subjected to offset correction and gain correction as occasion may demand, and are outputted to the monitor or the like.

The operation in the self-diagnosis mode will be described next. In this mode, the light (or X-rays) is not radiated (the dark state).

First, the controllable power source 4 is put in the state of the voltage Vs2. In this state the gate drive circuit applies an optional number of gate pulses to the gate electrodes to perform empty reading to read charges of the photoelectric conversion elements stored because of dark current or the like. In this description the empty reading operation turns the potential on the first electrode side of the photoelectric conversion elements to zero or the ground. The empty reading is effective, particularly, where the dark current is large and where the self-diagnosis of defect is carried out accurately.

Then the controllable power source 4 is switched into the state of the voltage Vs1 while the TFTs are kept off. This turns the potential of the first electrodes of the photoelectric conversion elements or the pin type photodiodes into the equal potential of (Vs1–Vs2) for all the photoelectric conversion elements. Namely, the photoelectric conversion elements can be charged electrically. In this state the gate drive circuit applies the gate pulses, whereby the charges electrically charged in the photoelectric conversion elements can be read out.

Signals read out here are used for the self-diagnosis of defective pixel. As long as the TFTs are free of degradation, the signal charges transferred to the reading unit are basically constant. However, if the TFTs undergo degradation because of secular change in use or the like, the transferred charges will decrease. Namely, the output becomes small. Therefore, a defect due to degradation of TFT can be detected by comparing the output in the self-diagnosis mode with the threshold by means of the comparator 5. FIG. 3 is the illustration of the apparatus with an analog comparator, but like function can also be realized with a digital comparator using a memory.

Positional information of a pixel determined as a defect because of the output below the threshold is stored in the memory for storage of defect position. The defect position storing memory of FIG. 3 indicates normal pixels by 0 and a defective pixel by 1, and shows a state in which the pixel of P2 is detected as a defect, as an example. The positional information of the defective pixel can be specified with correspondence between an address of the memory and the position of the pixel, for example, by storing the information of the pixels in the memory in order.

Further, the defective pixel is compensated for by interpolation using an average of adjacent pixel outputs by means of a compensation means not illustrated. Such interpolation means can be comprised of a DSP (digital signal processor) for carrying out an arithmetic operation by mutually referencing the data from the frame memory storing the image information and the data from the defect position storing memory.

A better image can be obtained by detecting the defect by the self-diagnosis and compensating for the defect as described above.

<Second Embodiment>

Figure 6A:
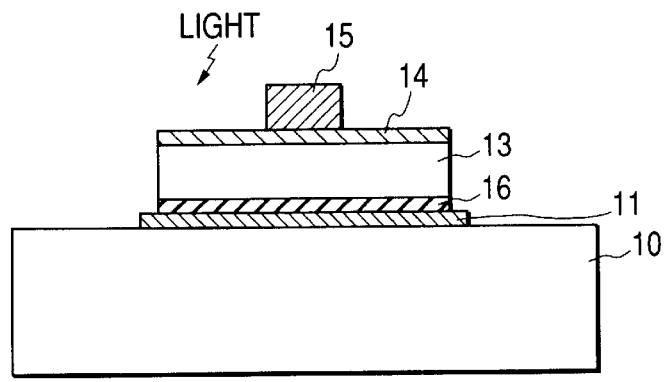
FIG. 6A shows schematically a sectional view of a photoelectric conversion element desirably for use in the photoelectric conversion apparatus according to the present invention.
Figure 6B:
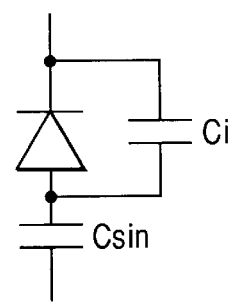
FIG. 6B shows schematically an equivalent circuit of one in FIG. 6A.
Figure 7:
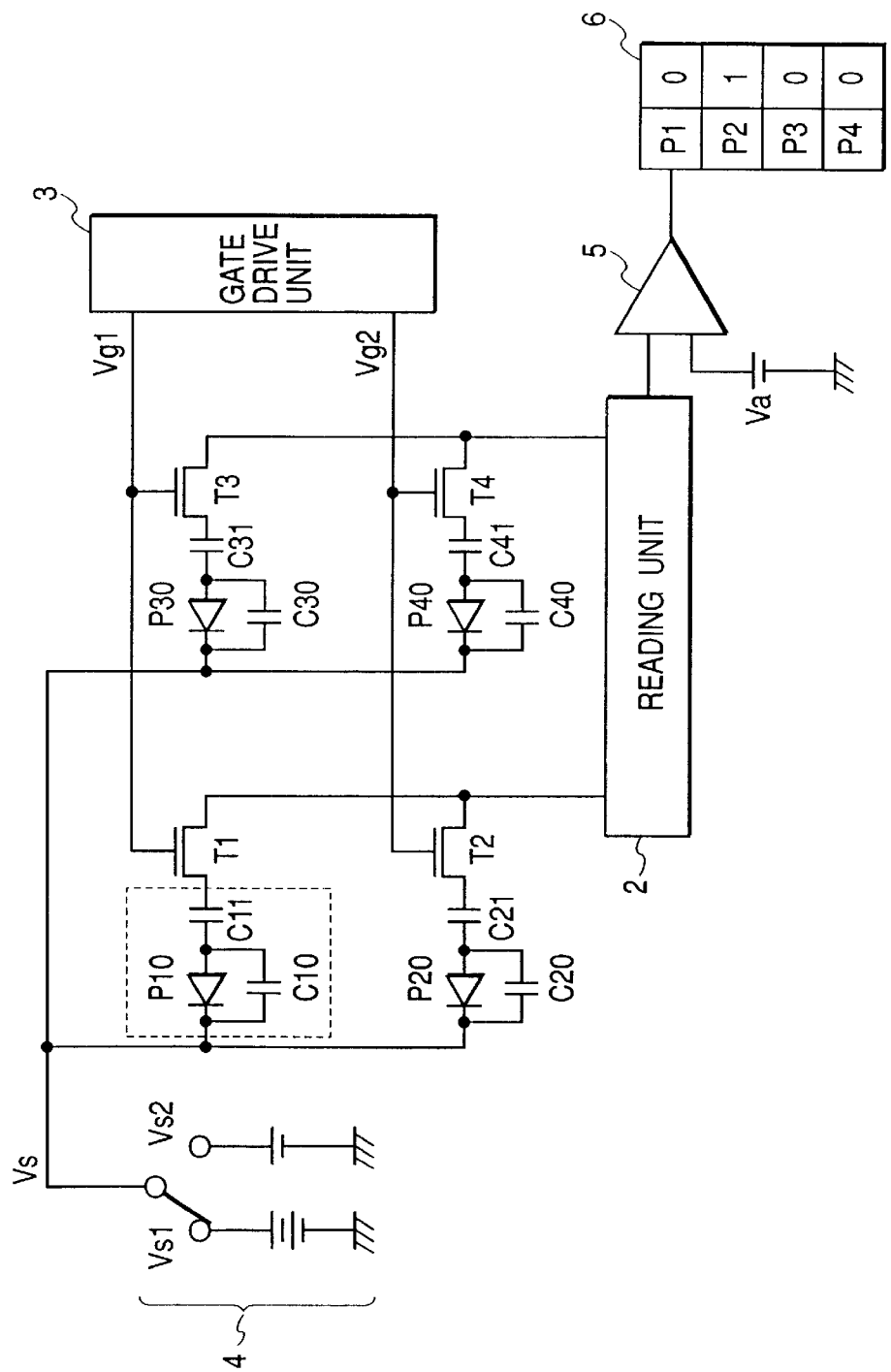
FIG. 7 shows schematically a circuit diagram of the photoelectric conversion apparatus according to a second embodiment of the present invention.

FIG. 6A is a schematic, sectional view of a photoelectric conversion element suitably applicable to the photoelectric conversion apparatus of the present invention and FIG. 6B a schematic equivalent circuit thereof. FIG. 7 is a schematic circuit diagram of the photoelectric conversion apparatus of the second embodiment.

In the present embodiment the photoelectric conversion elements are comprised of the MIS type sensors. As illustrated in FIG. 6A, the MIS type sensors of the present embodiment are constructed in the structure of a stack of first electrode layer 11, amorphous silicon nitride film layer 16 as an insulating layer, amorphous silicon semiconductor layer 13, n-type amorphous silicon layer 14, and second electrode layer 15 on glass substrate 10. As illustrated in the equivalent circuit diagram of FIG. 6B, the photoelectric conversion elements have the capacitance Csin, which is the capacitance of the amorphous silicon nitride film. The circuit diagram illustrated in FIG. 7 is different only in this point from the configuration of the circuit diagram of FIG. 3 described above, and the other structure is the same.

The operations of the present embodiment in the reading mode and in the self-diagnosis mode both can be carried out in similar fashion as in the first embodiment illustrated in FIG. 4.

<Third Embodiment>

Figure 8A:
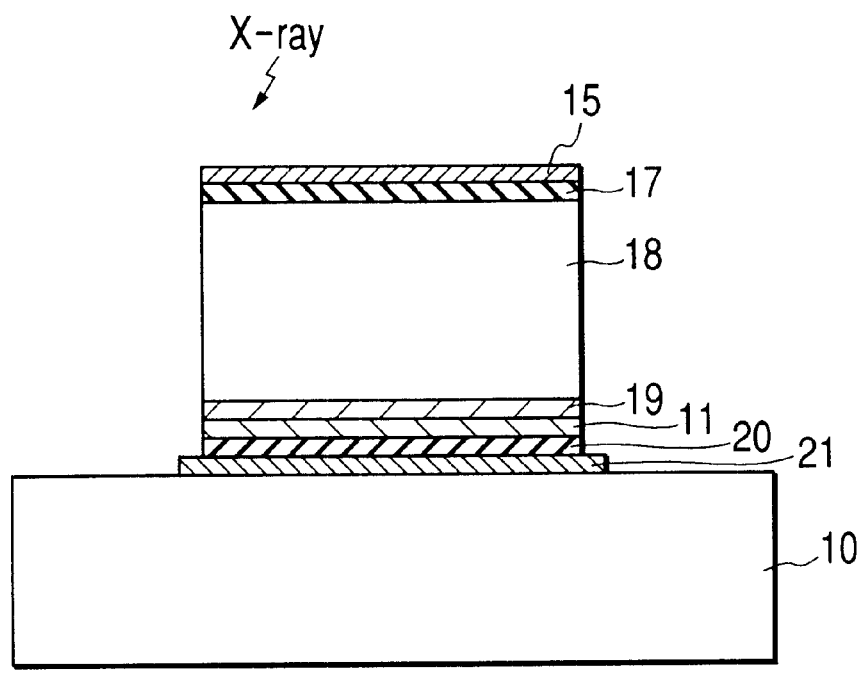
FIG. 8A shows schematically a sectional view of another example of the photoelectric conversion element desirably for use in the photoelectric conversion apparatus of the present invention.
Figure 8B:
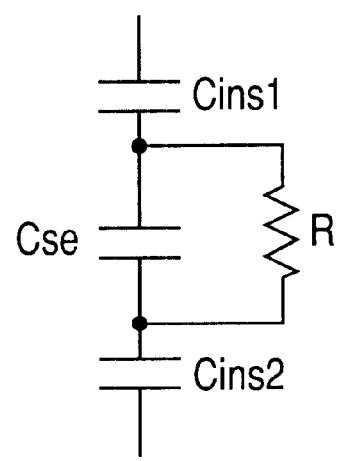
FIG. 8B shows schematically an equivalent circuit of one in FIG. 8A.
Figure 9:
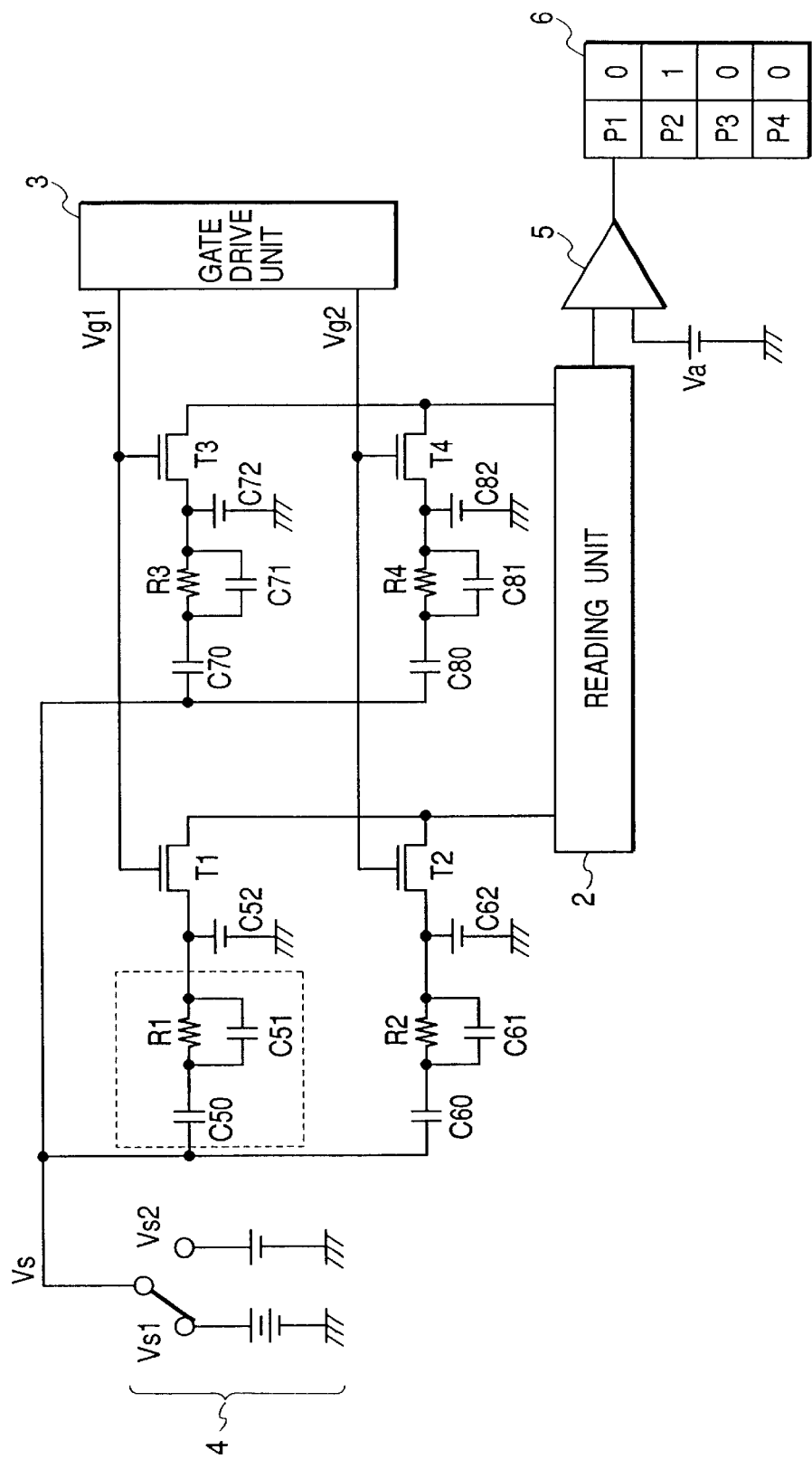
FIG. 9 shows a circuit diagram of photoelectric conversion apparatus according to a third embodiment of the present invention.

FIG. 8A is a schematic, sectional view of an example of another photoelectric conversion element suitably applicable to the photoelectric conversion apparatus of the present invention and FIG. 8B a diagram to show a schematic equivalent circuit thereof. FIG. 9 is a schematic circuit diagram of the photoelectric conversion apparatus of the third embodiment.

In the present embodiment the photoelectric conversion elements are constructed using amorphous selenium as a principal material. As illustrated in FIG. 8A, the photoelectric conversion elements of the present embodiment are constructed in the structure of a stack of third electrode layer 21, first insulating layer 20, first electrode layer 11, charge injection inhibiting layer 19, amorphous selenium semiconductor layer 18, second insulating layer 17, and second electrode layer 15 on glass substrate 10. Since the amorphous selenium semiconductor layer 18 is sensitive to X-rays, an X-ray image can be obtained directly.

As illustrated in the equivalent circuit diagram of FIG. 8B, the present embodiment is different in possession of Cins1, Cse, R, and Cins2 from Embodiment 1, wherein Cins1 is the capacitance of the first insulating layer, Cse the capacitance of the amorphous selenium semiconductor layer, R the resistance of the amorphous selenium semiconductor, and Cins2 the capacitance of the second insulating layer. As illustrated in the circuit diagram shown in FIG. 9, the present embodiment is different only in this point from Embodiment 1, and the other structure is the same as in Embodiment 1.

The operations of the present embodiment in the reading mode and in the self-diagnosis mode can be carried out in similar fashion as in the first embodiment illustrated in FIG. 4.

The photoelectric conversion apparatus of the present invention described above can replace the conventional photoelectric conversion apparatus to construct the X-ray image pickup apparatus, the facsimile machines, the scanners, or the like and can also detect and correct the defective pixels in the self-diagnosis mode described above in such apparatus.

An example of the information processing apparatus will be described briefly using a preferred example of application of the photoelectric conversion apparatus of the present invention to the X-ray image pickup apparatus.

Figure 10A:
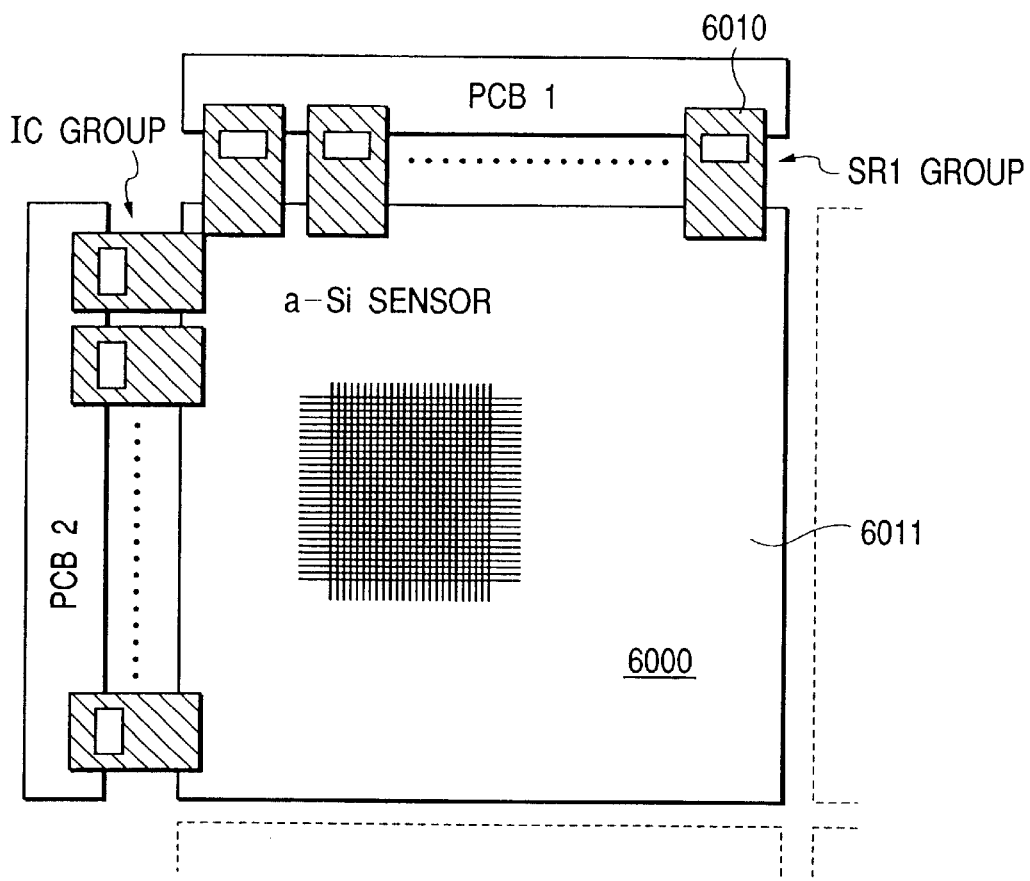
FIG. 10A shows schematically a structural diagram of an X-ray detecting photoelectric converter to which the present invention is adopted.
Figure 10B:
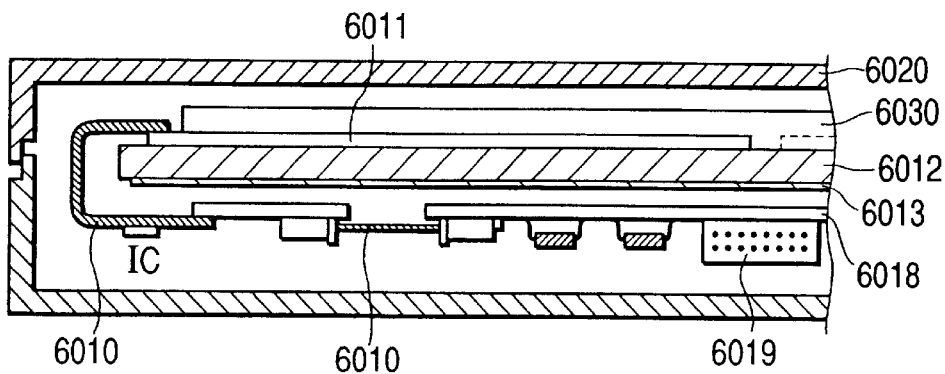
FIG. 10B shows schematically a sectional view of the X-ray detecting photoelectric converter in FIG. 10A.

FIG. 10A and FIG. 10B show an X-ray detecting photoelectric converter 6000 which adapts the present invention; FIG. 10A is a schematically structural diagram and FIG. 10B is a schematically sectional view.

The photoelectric converting element and the TFT are constituted in plural numbers inside an a-Si sensor substrate 6011 and connected with flexible circuit substrates 6010 on which shift registers SR1 and integrated circuits IC for detection are mounted. The opposite side of the flexible circuit substrates 6010 are connected with a PCB1 or a PCB2. A plurality of the a-Si sensor substrates 6011 are adhered onto a base 6012 so as to constitute a large-sized photoelectric converter. A lead plate 6013 is mounted under the base 6012 so as to protect memories 6014 in a processing circuit 6018 from X rays. A phosphor 6030, which is a wavelength conversion element, such as CsI or the like is coated on or adhered to the a-Si sensor substrate 6011. Further, numeral 6019 denotes a connector. In this embodiment, as shown in FIG. 10B, the whole is packed in a case 6020 made of carbon fiber.

Figure 11:
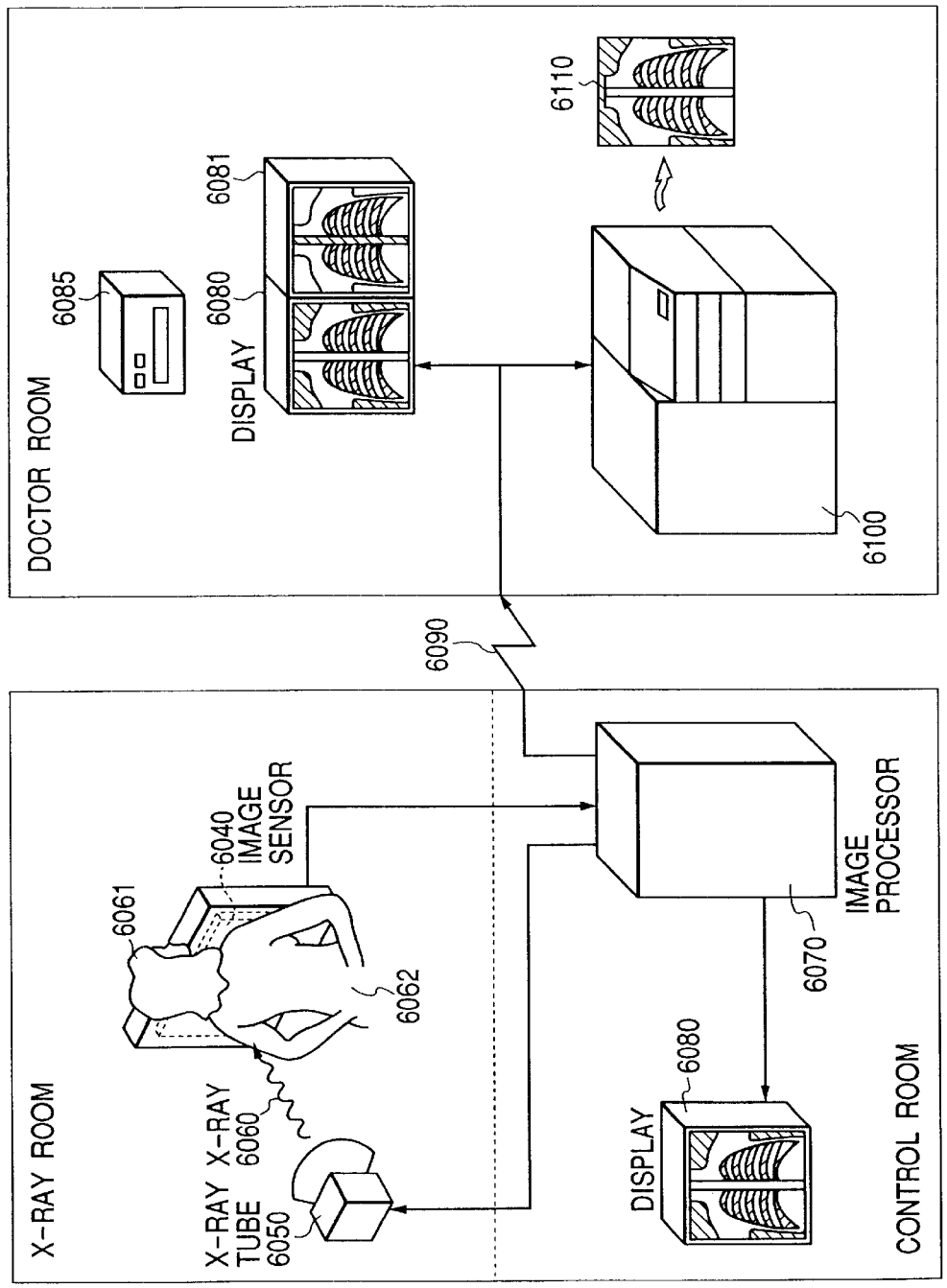
FIG. 11 shows an example in which the photoelectric conversion apparatus of the present invention is applied to an X-ray diagnosis system.

FIG. 11 shows an applied example in which the photoelectric converter of the present invention is applied to an X-ray diagnosis system.

X rays 6060 emitted from an X-ray tube 6050 are transmitted through the chest 6062 of a patient or an examinee 6061 to be incident to a photoelectric converter 6040 on which a phosphor as a wavelength conversion element has been mounted. The incident X rays include the internal information of the patient. Here, the phosphor emits light in response to the incident X rays and the emitted light is photoelectrically converted to obtain the electric information. The electric information is then converted to be digitalized and an image on the electric information is processed by an image processor 6070 to be able to observe on a display 6080 in a control room. This information can be transferred to a remote place, such as a doctor room located in other place or the like, by way of a transmission means such as a telephone line 6090 and displayed on a display 6081 or stored in a storage means such as an optical disk by recorder 6085, and this makes it possible to be diagnosed by a doctor in a remote place. Also, this information can be recorded on a film or recording medium as paper 6110 by a film processor or printer 6100.

EFFECT OF THE INVENTION

As described above, the present invention permits the user or the serviceman to detect the defective pixel during the operation or with a lapse of time in use at an arbitrary time or on a periodical basis in the simple structure and with high accuracy, even after the apparatus has been mounted on equipment.

In addition, the present invention permits the defective pixel with a malfunction to be specified accurately and permits the specifying operation of the defective pixel to be carried out readily by the extremely simple operation and self-diagnosis mode.

Further, the present invention permits prevention of the degradation of image quality by properly compensating for the output of the defective pixel.

What is claimed is:

1. A photoelectric conversion apparatus for reading information by arraying a plurality of pixels, each pixel comprising a photoelectric conversion element and a thin film transistor connected to the element, and applying a voltage to gate electrodes of the thin film transistors to switch the thin film transistors on, said photoelectric conversion apparatus comprising:

a controllable power source for electrically charging said photoelectric conversion elements by changing a voltage applied to electrodes of said photoelectric conversion elements to which said thin film transistors are not connected, from a first voltage applied during normal reading to a second voltage, and applying the second voltage to the electrodes in a dark state; and comparing means for comparing outputs read out of said charged photoelectric conversion elements with a predetermined threshold to detect a defective pixel.

2. The photoelectric conversion apparatus according to claim 1, further comprising memory means for storing a position of said detected defective pixel.

3. The photoelectric conversion apparatus according to claim 2, further comprising compensation means for carrying out interpolation using outputs of adjacent pixels to compensate for a signal of the defective pixel stored as positional information of the defective pixel in said memory means.

4. The photoelectric conversion apparatus according to claim 1, wherein means for detecting said defective pixel by self-diagnosis has two activity states of a reading mode and a defect self-diagnosis mode and has a function of switching the modes.

5. The photoelectric conversion apparatus according to claim 1, wherein each said thin film transistor has first and second electrodes to act as a source or as a drain, and a gate electrode, each said photoelectric conversion element has at least first and second electrodes, the first electrode of said thin film transistor is connected to the first electrode of said photoelectric conversion element, gate drive means is connected to the gate electrodes of said thin film transistors, and reading means is connected to the second electrodes of said thin film transistors.

6. The photoelectric conversion apparatus according to claim 1, wherein said photoelectric conversion elements comprise amorphous silicon.

7. The photoelectric conversion apparatus according to claim 1, wherein said thin film transistors comprise amorphous silicon.

8. The photoelectric conversion apparatus according to claim 1, wherein said photoelectric conversion elements are pin type photodiodes.

9. The photoelectric conversion apparatus according to claim 1, wherein said photoelectric conversion elements are MIS type sensors.

10. The photoelectric conversion apparatus according to claim 1, wherein said photoelectric conversion elements comprise amorphous selenium as a principal material.

11. A method for driving a photoelectric conversion apparatus for reading information by arraying a plurality of pixels, each pixel comprising a photoelectric conversion element and a thin film transistor connected to the element, and applying a voltage to gate electrodes of said thin film transistors to switch said thin film transistors on, said driving method comprising steps of:

providing the photoelectric conversion apparatus with a reading mode and a defect self-diagnosis mode, changing a voltage applied to electrodes of said photoelectric conversion elements to which said thin film transistors are not connected, from a first voltage applied in said reading mode to a second voltage, and applying the second voltage to the electrodes in a dark state in said defect self-diagnosis mode; and comparing outputs read out of said charged photoelectric conversion elements with a predetermined threshold to detect a defective pixel.

12. The driving method according to claim 11, wherein said defect self-diagnosis mode is said dark state in which no light or no X-ray is incident to said photoelectric conversion elements.

13. The driving method according to claim 11, wherein said thin film transistors are in an off state on the occasion of changing the voltage applied to said photoelectric conversion elements from the first voltage to the second voltage in said defect self-diagnosis mode.

14. The driving method according to claim 13, further comprising steps of carrying out empty reading to switch said thin film transistors on in a state in which the voltage applied to the electrodes of said photoelectric conversion elements to which said thin film transistors are not connected is said first voltage, in said defect self-diagnosis mode, and thereafter turning said thin film transistors off and changing the voltage applied to said electrodes of said photoelectric conversion elements to the second voltage.

15. The driving method according to claim 11, further comprising steps of comparing an output read out of the photoelectric conversion element of each pixel with a predetermined threshold to detect a pixel of an output below said threshold, as a defective pixel, and storing positional information of the defective pixel in a memory.

16. The driving method according to claim 15, further comprising a step of carrying out interpolation using outputs of adjacent pixels to compensate for a signal of the defective pixel stored as the positional information of the defective pixel in the memory.

17. An information processing apparatus comprising a photoelectric conversion apparatus for reading information by arraying a plurality of pixels, each pixel comprising a photoelectric conversion element and a thin film transistor connected to the element, and applying a voltage to gate electrodes of the thin film transistors to switch the thin film transistors on, and image processing means for processing the information from the photoelectric conversion apparatus, said information processing apparatus further comprising:

a controllable power source for electrically charging said photoelectric conversion elements by changing a voltage applied to electrodes of said photoelectric conversion elements to which said thin film transistors are not connected, from a first voltage applied during normal reading to a second voltage, and applying the second voltage to the electrodes in a dark state; and comparing means for comparing outputs read out of said charged photoelectric conversion elements with a predetermined threshold to detect a defective pixel.

18. The information processing apparatus according to claim 17, further comprising memory means for storing a position of said detected defective pixel.

19. The information processing apparatus according to claim 18, further comprising compensation means for carrying out interpolation using outputs of adjacent pixels to compensate for a signal of the defective pixel stored as positional information of the defective pixel in said memory means.

20. The information processing apparatus according to claim 17, wherein means for detecting said defective pixel by self-diagnosis has two activity states of a reading mode and a defect self-diagnosis mode and has a function of switching the modes.

21. The information processing apparatus according to claim 17, wherein each said thin film transistor has first and second electrodes to act as a source or as a drain, and a gate electrode, each said photoelectric conversion element has at least first and second electrodes, the first electrode of said thin film transistor is connected to the first electrode of said photoelectric conversion element, gate drive means is connected to the gate electrodes of said thin film transistors, and reading means is connected to the second electrodes of said thin film transistors.

22. The information processing apparatus according to claim 17, wherein said photoelectric conversion elements comprise amorphous silicon.

23. The information processing apparatus according to claim 17, wherein said thin film transistors comprise amorphous silicon.

24. The information processing apparatus according to claim 17, wherein said photoelectric conversion elements are pin type photodiodes.

25. The information processing apparatus according to claim 17, wherein said photoelectric conversion elements are MIS type sensors.

26. The information processing apparatus according to claim 17, wherein said photoelectric conversion elements comprise amorphous selenium as a principal material.

27. The information processing apparatus according to claim 17, further comprising a recorder.

28. The information processing apparatus according to claim 17, further comprising a display.

29. The information processing apparatus according to claim 17, further comprising a printer.

30. The information processing apparatus according to claim 17, further comprising communication means.

31. A photoelectric conversion apparatus for reading information by arraying a plurality of pixels, each pixel comprising a photoelectric conversion element having at least two electrodes and a thin film transistor connected to a first electrode of said photoelectric conversion element, and applying a voltage to gate electrodes of the thin film transistors to switch the thin film transistors on, said photoelectric conversion apparatus comprising:

a controllable power source connected to a second electrode of said photoelectric conversion element for electrically charging said photoelectric conversion elements by changing a voltage applied to the second electrode of said photoelectric conversion elements from a first voltage to a second voltage, in a dark state; and comparing means for comparing outputs read out of said charged photoelectric conversion elements with a predetermined threshold, to detect a defective pixel.

32. The photoelectric conversion apparatus according to claim 31, wherein said second voltage is one to be applied during normal reading.

33. The photoelectric conversion apparatus according to claim 31, further comprising memory means for storing a position of said detected defective pixel.

34. The photoelectric conversion apparatus according to claim 33, further comprising compensation means for carrying out interpolation using outputs of adjacent pixels to compensate for a signal of the defective pixel stored as positional information of the defective pixel in said memory means.

35. The photoelectric conversion apparatus according to claim 31, wherein means for detecting said defective pixel by self-diagnosis has two activity states of a reading mode and a defect self-diagnosis mode and has a function of switching the modes.

36. The photoelectric conversion apparatus according to claim 31, wherein each said thin film transistor has first and second electrodes to act as a source or as a drain, and a gate electrodes, each said photoelectric conversion element has at least first and second electrodes, the first electrode of said thin film transistor is connected to the first electrode of said photoelectric conversion element, gate drive means is connected to the gate electrodes of said thin film transistors, and reading means is connected to the second electrodes of said thin film transistors.

37. The photoelectric conversion apparatus according to claim 31, wherein said photoelectric conversion element comprise amorphous silicon.

38. The photoelectric conversion apparatus according to claim 31, wherein said thin film transistors comprise amorphous silicon.

39. The photoelectric conversion apparatus according to claim 8, wherein said photoelectric conversion elements are pin type photodiodes.

40. The photoelectric conversion apparatus according to claim 31, wherein said photoelectric conversion elements are MIS type sensors.

41. The photoelectric conversion apparatus according to claim 31, wherein said photoelectric conversion elements comprise amorphous selenium as a principal material.

42. The photoelectric conversion apparatus according to claim 31, wherein said comparing means comprises an analog comparator.

43. The photoelectric conversion apparatus according to claim 31, wherein said comparing means comprises a digital comparator.

44. The photoelectric conversion apparatus according to claim 31, wherein said comparing means comprises a memory and a digital comparator.

45. The photoelectric conversion apparatus according to claim 31, wherein said comparing means compares an output converted into digital signal through A/D converter with a threshold value preliminary stored in a memory.

46. The photoelectric conversion apparatus according to claim 31; wherein said photoelectric conversion element is a radiator sensor for reading an information carried by X-ray.

47. The photoelectric conversion apparatus according to claim 31, wherein said photoelectric conversion element comprises a wavelength converter.

48. The photoelectric conversion apparatus according to claim 47, wherein said wavelength converter is a phosphor.

49. The photoelectric conversion apparatus according to claim 47, wherein said wavelength convertor contains CsI as a main material.

50. The photoelectric conversion apparatus according to claim 31, wherein said photoelectric conversion element contains a semiconductor sensitive to X-ray.

51. A radiation image pickup apparatus comprising an X-ray generation means, a conversion element having at least two electrodes for detecting an X-ray emitted from said X-ray generation means and converting the X-ray into an electric signal and a switching element connected to a first electrode of said conversion element, characterized by comprising:

a power source for charging said conversion element by changing a voltage applied to a second electrode of said conversion element from a first voltage to a second voltage at a state that said conversion element is not irradiated with radiation; and means for comparing with a predetermined threshold value an output from said conversion element charged, thereby detecting a defective pixel.

52. A method for driving a photoelectric conversion apparatus for reading information by arraying a plurality of pixels, each pixel comprising a photoelectric conversion element having at least two electrodes and a thin film transistor connected to a first electrode of said photoelectric conversion element, and applying a voltage to gate electrode of thin film transistors to switch said thin film transistors on, said driving method comprising the steps of:

providing the photoelectric conversion apparatus with a reading mode and a defect self-diagnosis mode, and electrically charging said photoelectric conversion elements by changing a voltage applied to a second electrode of said photoelectric conversion elements from a first voltage to a second voltage, in a dark state, in said defect self-diagnosis mode; and comparing outputs read out of said charged photoelectric conversion elements with a predetermined threshold, to detect a defective pixel.

53. The driving method according to claim 52, wherein said second voltage is one to be applied during the reading mode.

54. The driving method according to claim 52, wherein said defect self-diagnosis mode is said dark state in which no light or no X-ray is incident to said photoelectric conversion elements.

55. The driving method according to claim 52, wherein said thin film transistors are in an off state on the occasion of changing the voltage applied to said photoelectric conversion elements from the first voltage to the second voltage in said defect self-diagnosis mode.

56. The driving method according to claim 55, further comprising steps of carrying out empty reading to switch said thin film transistors on in a state in which the voltage applied to the electrodes of said photoelectric conversion elements to which said thin film transistors are not connected is said first voltage, in said defect self-diagnosis mode, and thereafter turning said thin film transistors off and changing the voltage applied to said electrodes of said photoelectric conversion elements to the second voltage.

57. The driving method according to claim 52, further comprising steps of comparing an output read out of the photoelectric conversion element of each pixel with a predetermined threshold to detect a pixel of an output below said threshold, as a deflective pixel, and storing positional information of the defective pixel in a memory.

58. The driving method according to claim 57, further comprising a step of carrying out interpolation using outputs of adjacent pixels to compensate for a signal of the defective pixel stored as the positional information of the defective pixel in the memory.

59. An information processing apparatus comprising a photoelectric conversion appatratus for reading information by arraying a plurality of pixels, each pixel comprising a photoelectric conversion element having at least two electrodes and a thin film transistor connected to a first electrode of said photoelectric conversion element, and applying a voltage to gate electrode of the thin film transistor to switch the thin film transistors on, and image processing means for processing the information from the photoelectric conversion apparatus, said information processing apparatus further comprising:

a controllable power source for electrically charging said photoelectric conversion elements by changing a voltage applied to a second electrode of said photoelectric conversion elements from a first voltage to a second voltage, in dark state; and comparing means for comparing outputs read out of charged photoelectric conversion elements with a predetermined threshold to detect a detective pixel.

60. The information processing apparatus according to claim 59, wherein said second voltage is one to be applied during normal reading.

61. The information processing apparatus according to claim 59, further comprising memory means for storing a position of said detected defective pixel.

62. The information processing apparatus according to claim 61, further comprising compensation means for carrying interpolation using outputs of adjacent pixels to compensate for a signal of the defective pixel stored as positional information of the defective pixel in said memory means.

63. The information processing apparatus according to claim 59, wherein means for detecting said defective pixel by self-diagnosis has two activity states of a reading mode and a defect self-diagnosis mode and has a function switching the modes.

64. The information processing apparatus according to claim 59, wherein each said thin film transistor has first and second electrode to act as a source or as a drain, and a gate electrode, each said photoelectric conversion element has at least first and second electrodes, the first electrode of said thin film transistor is connected to the first electrode of said photoelectric conversion element, gate drive means is connected to the gate electrodes of said thin film transistors, and reading means is connected to the second electrodes of said thin film transistors.

65. The information processing apparatus according to claim 59, wherein said photoelectric conversion elements comprise amorphous silicon.

66. The information processing apparatus according to claim 59, wherein said thin film transistors comprise amorphous silicon.

67. The information processing apparatus according to claim 59, wherein said photoelectric conversion elements are pin type photodiode.

68. The information processing apparatus according to claim 59, wherein said photoelectric conversion elements are MIS type sensors.

69. The information processing apparatus according to claim 59, wherein said photoelectric conversion elements comprise amorphous selenium as a principal material.

70. The information processing apparatus according to claim 59, further comprising a recorder.

71. The information processing apparatus according to claim 59, further comprising a display.

72. The information processing apparatus according to claim 59, further comprising a printer.

73. The information processing apparatus according to claim 59, further comprising communication means.

* * * * *

UNITED STATES PATENT AND TRADEMARK OFFICE
CERTIFICATE OF CORRECTION

PATENT NO. : 6,512,217 B1
DATED : January 28, 2003
INVENTOR(S) : Toshio Kemeshima It is certified that error appears in the above-identified patent and that said Letters Patent is hereby corrected as shown below:

Column 2,
Line 67, "operation;" should read -- operation: --.

Column 4,
Line 41, "gate drive unit 2" should read -- gate drive unit 3 --; and
Line 52, "follows;" should read -- follows: --.

Column 11,
Line 6, "electrodes," should read -- electrode, --;
Line 14, "element" should read -- elements --;
Line 20, "claim 8," should read -- claim 38, --;
Line 40, "preliminary" should read -- preliminarily --; and
Line 42, "claim 31;" should read -- claim 31, --.

Column 13,
Line 6, "detective" should read -- defective --;
Line 14, "rying" should read -- rying out --; and
Line 25, "electrode" should read -- electrodes --.

Column 14,
Line 12, "photodiode." should read -- photodiodes. --.

Signed and Sealed this

Seventh Day of October, 2003

JAMES E. ROGAN
*Director of the United States Patent and Trademark Office*